United States Patent
Hsu et al.

(10) Patent No.: US 6,680,681 B1
(45) Date of Patent: Jan. 20, 2004

(54) HIGH SPEED FIR TRANSMITTER

(75) Inventors: Louis L. Hsu, Fishkill, NY (US);
William R. Kelly, Verbank, NY (US);
Joseph Natonio, Poughkeepsie, NY (US);
Karl D. Selander, Hopewell Junction, NY (US);
Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,795

(22) Filed: May 8, 2003

(51) Int. Cl.[7] ................................................. H03M 1/10
(52) U.S. Cl. ....................................... 341/144; 341/120
(58) Field of Search ................................. 341/144, 120, 341/141, 118

(56) References Cited

U.S. PATENT DOCUMENTS 6,507,296 B1    1/2003   Lee et al. .................... 341/120

*Primary Examiner*—Brian Young
(74) *Attorney, Agent, or Firm*—Steven Capella

(57) ABSTRACT

A transmitter for driving a transmission medium employs pre-distortion to predistort the signals leaving the driver so that they will have an acceptable shape when they reach their destination and have been distorted by imperfections in the transmission medium. The change to pulse height is accomplished by means of a current steering unit that directs a controllable amount of current into the line for each pulse while maintaining the total sum of current that is generated constant in order to reduce noise. Control coefficients for the current steering unit are manipulated in an nxm register that automatically maintains the total number of bits constant while bits are moved from a location that controls a first current driver to a location that controls a second current driver with different properties.

19 Claims, 16 Drawing Sheets

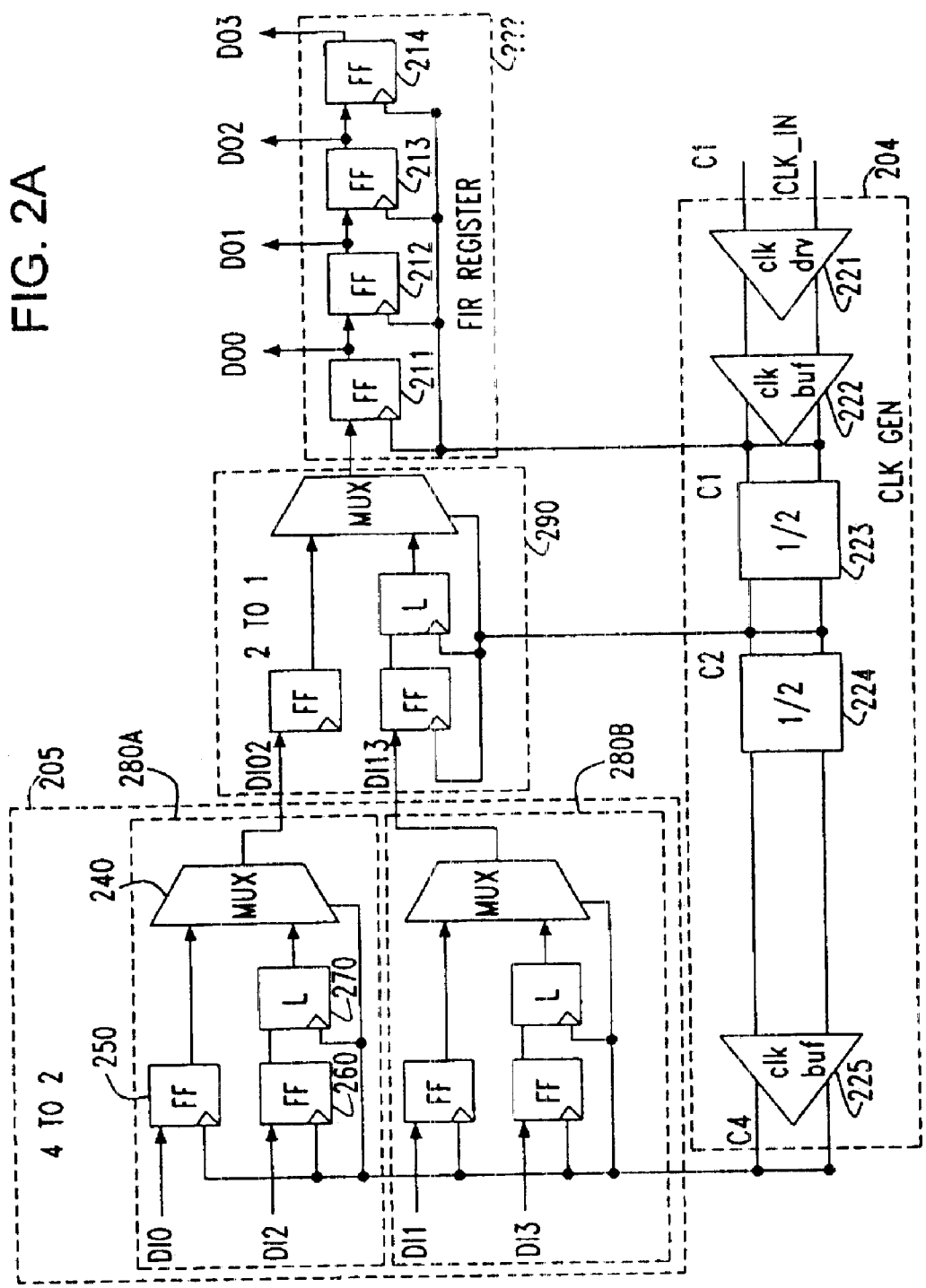

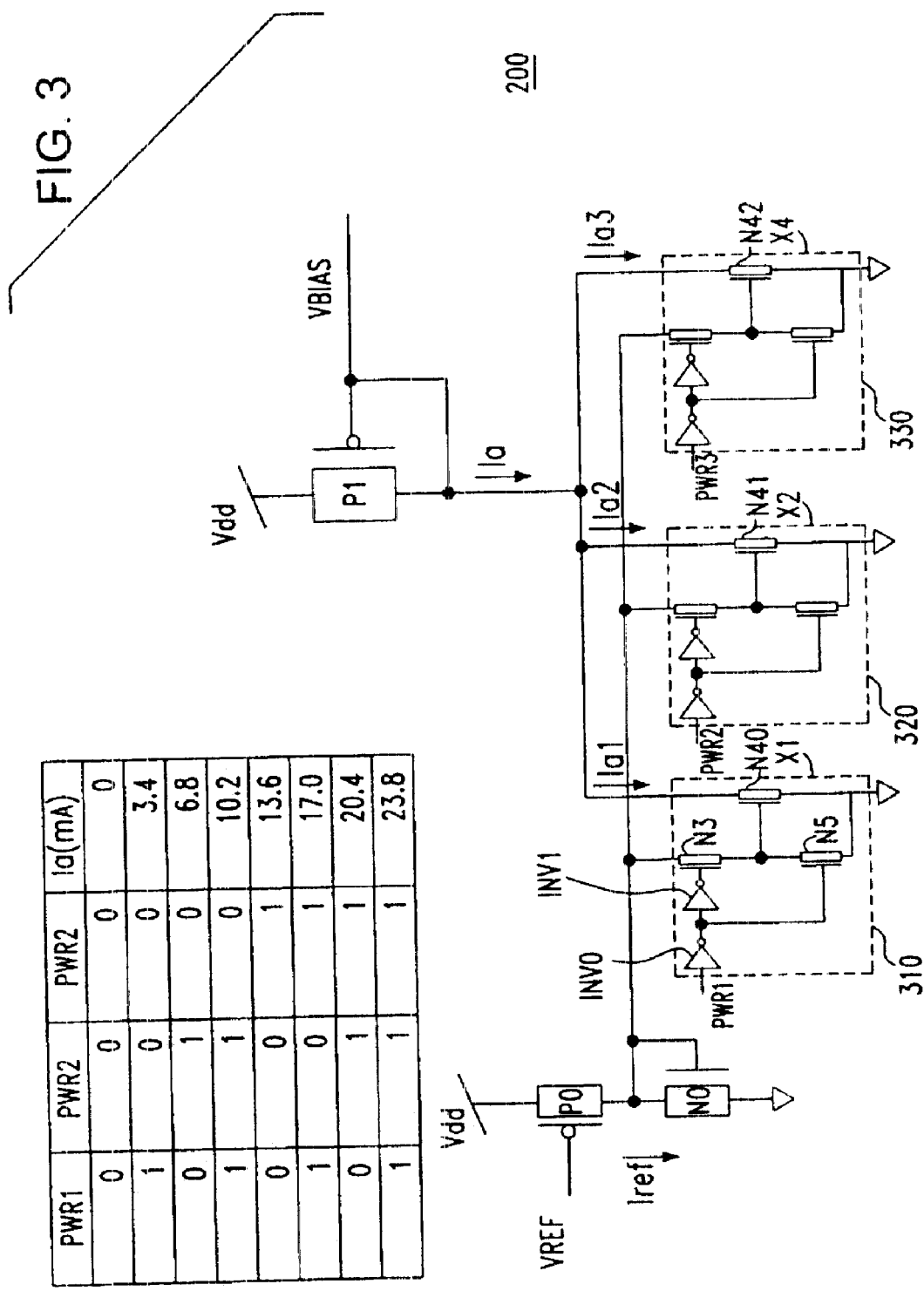

STEP-2

| 1 | 1 | 1 | 1 | 1 | 1 | 1 | 1 | 1 | 1 | 1 | 1 | 1 | 1 | 1 | 1 |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

STEP-3

| 0 | 0 | 0 | 0 | 1 | 1 | 1 | 1 | 1 | 1 | 1 | 1 | 1 | 1 | 1 | 1 |
|---|---|---|---|---|---|---|---|---|---|---|---|---|---|---|---|
| 1 | 1 | 1 | 1 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

STEP-4

| 0 | 0 | 0 | 0 | 1 | 1 | 1 | 1 | 1 | 1 | 1 | 1 | 1 | 1 | 1 | 1 |
|---|---|---|---|---|---|---|---|---|---|---|---|---|---|---|---|
| 0 | 0 | 1 | 1 | 0 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

STEP-5

| 0 | 0 | 0 | 0 | 1 | 1 | 1 | 1 | 1 | 1 | 1 | 1 | 1 | 1 | 1 | 1 |
|---|---|---|---|---|---|---|---|---|---|---|---|---|---|---|---|
| 0 | 0 | 1 | 1 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 |

FIG. 10

|   | X |   |   | X-Y |   |   | y |   |   | Y-Z |   |   | Z |   |   |      |
|---|---|---|---|-----|---|---|---|---|---|-----|---|---|---|---|---|------|
| 0 | 0 | 0 | 0 | 0   | 0 | 0 | 0 | 0 | 0 | 0   | 0 | 1 | 1 | 1 | 1 | A=4.0 |
| 1 | 1 | 1 | 1 | 1   | 1 | 1 | 1 | 1 | 1 | 1   | 1 | 0 | 0 | 0 | 0 | B=9.5 |
| 1 | 1 | 1 | 0 | 0   | 0 | 0 | 0 | 0 | 0 | 0   | 0 | 0 | 0 | 0 | 0 | C=1.5 |
| 0 | 0 | 0 | 0 | 0   | 0 | 1 | 1 | 0 | 0 | 0   | 0 | 0 | 0 | 0 | 0 | D=1.0 |

|   | X |   |   | X-Y |   |   | y |   |   | Y-Z |   |   | Z |   |   |      |
|---|---|---|---|-----|---|---|---|---|---|-----|---|---|---|---|---|------|
| 0 | 0 | 0 | 0 | 0   | 0 | 0 | 0 | 0 | 0 | 0   | 1 | 1 | 1 | 1 | 1 | A=4.0 |
| 1 | 1 | 1 | 1 | 1   | 1 | 1 | 1 | 1 | 1 | 1   | 0 | 0 | 0 | 0 | 0 | B=9.5 |
| 1 | 1 | 1 | 1 | 0   | 0 | 0 | 0 | 0 | 0 | 0   | 0 | 0 | 0 | 0 | 0 | C=1.5 |
| 0 | 0 | 0 | 0 | 0   | 0 | 0 | 1 | 0 | 0 | 0   | 0 | 0 | 0 | 0 | 0 | D=0.5 |

HIGH SPEED FIR TRANSMITTER

BACKGROUND OF THE INVENTION

The field of the invention is that of transmitting data along transmission media having attenuation, in particular precompensating the data for attenuation along a cable or other medium.

It is known in the art that by implementing a filter in a current mode transmitter, one can perform pre-emphasis on the outgoing signals to fight against the attenuation effect caused by the transmission media. This effect becomes more severe when data frequency is getting higher. It is also reported that, an adaptive equalizer can be used to save power for an A/D converter. In the A/D converter example, the coefficients of the filter are prestored in an EPROM memory array, also called a "look-up table". A similar method is also taught in U.S. Pat. No. 5,519,398, "Signal Processing Apparatus Having A/D Conversion Function". A comparator is used to compare an incoming analog signal with a plurality of preset reference levels and generate a thermometer code. A decoder is used to detect a change point of the thermometer code which in turn selects a row of the memory array. The contents that are extracted from the selected row are the predetermined tap coefficients which are fed to the filter to perform equalization. Other examples, such as in U.S. Pat. No. 6,266,379, mention how to use a DRAM or SRAM memory to store tap coefficients for a high-speed transmitter.

In the past, the filter coefficients have been predetermined based on design and known environment. In this case, the coefficients can be "burned" in a ROM type memory. However, as the media environment becomes more variable, the coefficients sometimes must be reset (or reprogrammed) during a training period. Even during operating period, the filter coefficients may also need to be updated to cope with environment (e.g. temperature) change so to maintain a maximum link capability. A look up table formed by a random access memory or nonvolatile memory requires a technology of embedded memory, size, cost and complexity in design may therefore be unacceptable.

In U.S. Pat. No. 5,857,001, titled, "Off Chip Driver with Precompensation for Cable Attenuation", by Preuss et al., a method is taught on how to create peaks with exponential tails at every signal transition. Whenever a transition occurs, a peak with an exponential is created on the signals so to compensate for transmission media attenuation. However, this approach may not work in a high-frequency domain when the cycle time is shorter than the RC time constant of the exponential tail. This approach becomes less efficient for transmitting signals with high frequency transitions. In other words, depending on the bit data pattern, some peaks may not be necessary.

Proposed by Wurster et. al., U.S. Pat. No. 5,204,880, titled, "Differential Line Driver Employing Predistortion", is a method to selectively power the driver with full or partial-step voltage levels depending on the outgoing bit data pattern. For example, when fat bits, e.g. several "1s" or "0s" are transmitting, waveforms are created with partial-step voltages, and when the skinny bits, e.g. single "1" or "0", are transmitting, waveforms are created with full-steps. This approach is similar to the previous one, and possesses similar pros and cons. No programmability is provided for both designs. No resolution (or weight) is provided for adjusting the amplitude of the waveform between different fat and skinny bit patterns. These designs are not flexible and can not fit for a variety of package environments.

A design is proposed by Murakami et al., titled "Equalizer" in U.S. Pat. No. 5,068,873, in which a receiver is equipped with an equalizer which is formed by a set of feed-forward FIR filters, a set of feed-backward FIR filters, a decision element, and on-chip algorithms and computation circuits to perform decision feedback equalization to minimize the signal distortion. Basically, this adaptive equalization consists of two operations: (1) receive a known signal sequence to roughly estimate transmission channel characteristics and set the tap coefficients by use of a first algorithm and first computation circuit; and (2) receive a random signal sequence to continuously update the coefficients by using a less complex second algorithm and second computation circuits. The design, although complicated, possesses a capability of continuously optimizing the signal to compensate for channel distortion. In this patent, however, there is no mention of how to implement coefficient updating at the circuit level.

SUMMARY OF THE INVENTION

The first part of the present invention relates, in general, to how to improve data transmission quality and in particular to extending the distance over which data may be transmitted in transmission media. A feature of the present invention is a current steering circuit which is used to facilitate the adaptive preequalization to a data transmission waveform which compensates noise due to distortion and cross coupling inherent in the transmission media.

One object of the invention is to design adaptive equalization for the driver so that it can provide pre-emphasis on the transmitting signals so that they can compensate the channel distortion when they are received at the far-end receiver.

Another object of the invention is to design an adaptive equalization for the driver so that it can also provide a partial-response effect on the transmitting signals so that transmitted high-frequency signals would not cause disturbances at the near-end receivers.

Another object of the invention is that the pulse of the current bit is dynamically modified based on the information from the adjacent bits (e.g., based on the polarity and the location of the adjacent bits). The bit that is right next to it will have more influence than the one that located farther away. The polarity of the signal determines whether the amplitude of the current bit should be enhanced or retarded.

Another aspect of the present invention relates to a programmable filter whose coefficients are stored and managed in an "nxm" programmable thermometric register array, in which the number of rows "n" of the register array is determined by the number of the taps provided by the filter; and the number of columns "m" is determined by the weight resolution of the coefficients. The higher number of "m", the finer the granularity of the weight among the taps can be set. This will become more clear when the drawings are described in a later section. An aspect of the invention is that any of the "n" rows of the register array can be assigned as the main bit, with a future bit (influenced by bits later in time) and two previous bits (influenced by bits earlier in time).

Another aspect of the invention is that the register can be in-situ programmed starting from the main bit and progressed towards the nearest adjacent bits and farther.

Yet another aspect of the invention is that the data among the rows of the thermometric register array is maintained in a balanced state; e.g. the total number of logic "1" states is kept unchanged, so to keep the driver at a constant nominal current.

BRIEF DESCRIPTION OF THE DRAWINGS

FIG. 2A shows a serializer module.

FIG. 3 shows a power level module.

FIG. 10 shows steps in manipulating coefficients in the register of FIG. 9.

FIGS. 16A and 16B show data locations in an alternative embodiment of the register.

DETAILED DESCRIPTION

Signal attenuation along a transmission medium (cable) of a few meters can easily reach −18 dB at a 3.2 Gbps data rate. This is equivalent to transmitting a signal with 400 mV amplitude at the driver end that becomes only 50 mV when the signal reaches the receiver end. In general, signal loss due to ISI (inter symbol interference) can be compensated somewhat, but unconditional preemphasis of the signal at the driver end is undesirable since it will cause signal degradation of the near end receivers due to cross-talk. In such a case, extra preemphasis becomes wasteful and useless. One may want to distribute the energy among more bits, or use a partial response technique to minimize the near end cross-talk problem.

In the following example, we use 4 bits (or a 4 tap FIR) to perform signal equalization. One may use more than 4 bits, such as 8 bits or even more (e.g. N bits). At any given time, the amplitude of the current bit will be tuned based on the information input by all bits. The more bits one uses, the more flexibility with which one can tune the current bit. Since the energy is distributed among more bits, there will be less drastic changes occurring from bit to bit, so that signal induced cross-talk noise can be reduced.

An ideal driver should be able to perform both preemphasis and partial response, so that it will deliver proper amounts of energy to the far-end receiver, but not cause disturbance to the near-end, receivers. Therefore, one object of the invention is to design adaptive equalization for the driver so that it can provide pre-emphasis on the transmitting signals so that they can compensate the channel distortion when they are received at the far-end receiver. Another object of the invention is to design adaptive equalization for the driver so that it can also provide a partial-response effect on the transmitting signals so that transmitted high-frequency signals would not cause disturbances at the near-end receivers. The invention thus proposes a design at the circuit level, in general, to demonstrate how to implement such an equalizer, while more specifically in the area how to update the tap coefficients of the FIR filter through a new current steering circuit.

Figure 1:
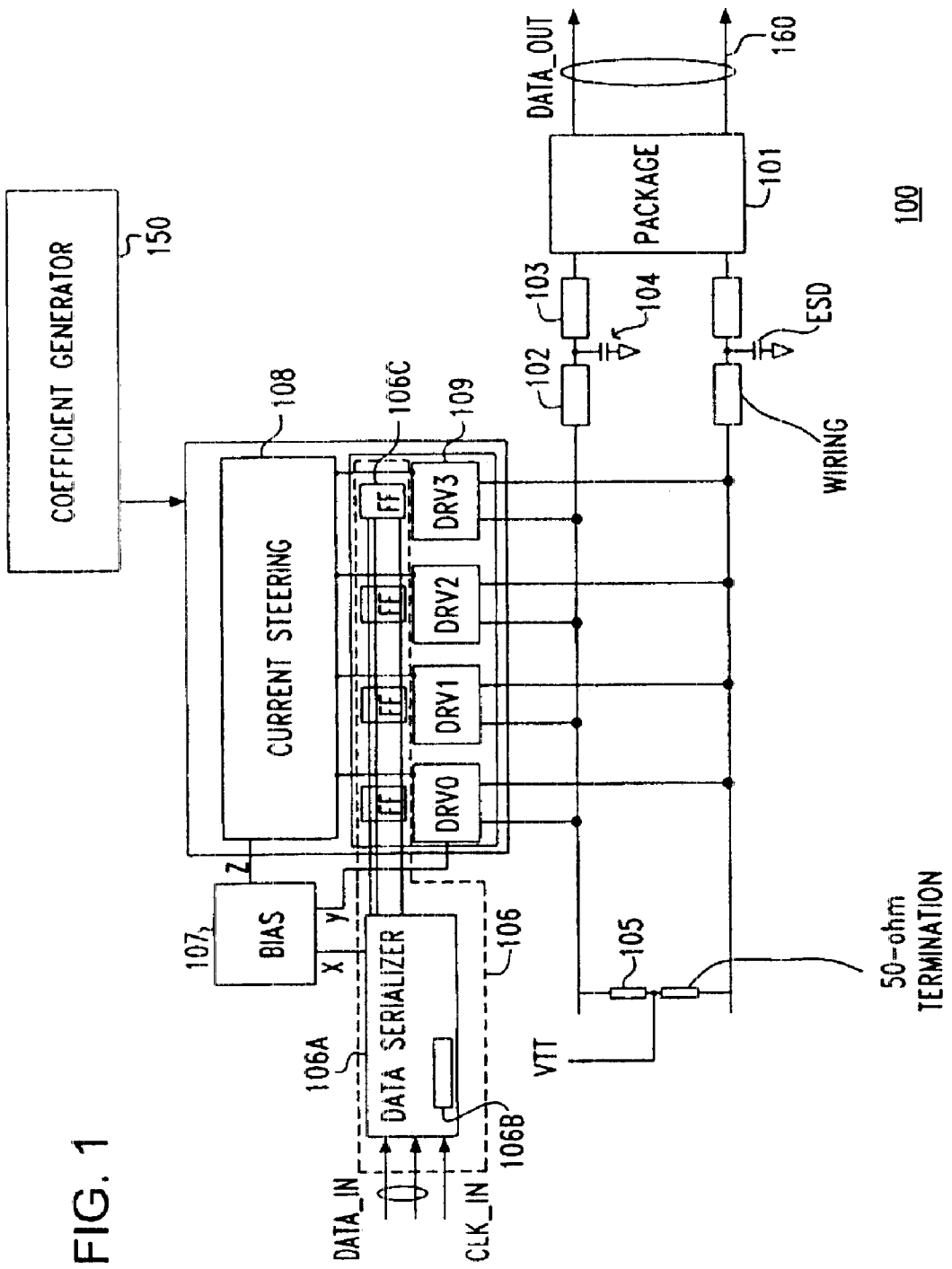
FIG. 1 shows a block diagram of a system according to the invention.

A driver system using a FIR (finite impulse response) filter to conduct signal preequalization is shown in FIG. 1. Note that implementation of a FIR filter for signal equalization is known in the art, but the design of the current steering unit is an advantageous feature of the invention. The system comprises a data serializer 106A, a 4 bit delayed flip-flop 106C, a bias generator 107, a current steering unit 108, four sets of driver blocks 109 and a signal traveling path. The data serializer receives a set of 4 parallel incoming data (i.e. data__in) and a full rate clock signal (i.e. clk__in) and converts the parallel data into a serial data stream. The resulting sequential 4 bits are latched in a corresponding flip-flop during each subsequent clock cycle, the current representing these 4 bits is modified by the 4-tap FIR pre-equalization.

Unit 108 is a current steering block that receives FIR coefficients from a coefficient generator 150 (which is described in the second part of the invention). The coefficients determine the weight of each tap during the equalization process.

Four bits that are stored in FFs 109 dictate the signs of the coefficients. For example, if a bit is a logic "one", then it gives a positive sign to the corresponding coefficient, or otherwise a negative sign. The summation of coefficients with signs of four, bits represented as current level of each driver in 109 which yields the final signal strength of the current bit. Its differential signal pair is sent to the wire 160 of data-out through a package component 101.

It is known that the more tap numbers used in the driver design, the lower the frequency range in which a FIR can perform pre-equalization. In other words, if the data have a long stream of ones or zeroes, it appears that the signal is swinging at a lower frequency. Having more taps, one can equalize lower frequency components more accurately. On the other hand, if we only have few taps, then the low frequency wave would have to adjust faster, less smoothly, which creates more jitter and cross-talk.

The data serializer further contains a clock generator 106B which generates ½ and ¼ clock rates from the incoming full rate used for data serialization. The bias, generator provides different levels of voltage/current reference for adjacent units. For example, a first reference "z" is fed to current steering unit 108, a second reference "y" is fed to the driver unit and a third reference "x" is needed by the data serializer. The current steering unit 108 receives a plurality of coefficient control bits from a controller or a coefficient generator (not shown here) which determines how much the value of each coefficient will be assigned for each data bit for pre-equalization operation. Finally, along the data path there are a source-end 50-ohm termination 105 circuit, some on-chip wiring 102 and 103, an ESD component 104 and package components such as pad, ball and traces, etc (represented schematically by box 101).

One example of the data serializer unit 106 is shown in FIG. 2A. It comprises a 4 to 2 data converter 205, a 2 to 1 data converter 290, a 4-bit FIR shift register 203 and a clock generator 204. The 4 to 2 data converter 205 further comprises a first 2 to 1 data converter unit 280A, and a second 2 to 1 data converter unit 280B. Each 2 to 1 data converter unit is constructed by using two flip-flop cells 250, and 260, a delay unit 270 and a multiplexer unit 240. Data DI0 and DI2 are processed via the first 2 to 1 unit 280A. While data DI1 and DI3 are processed in the second 2 to 1 unit. The data serialization steps are like this, first, four parallel data are simultaneously latched in four parallel flip-flop latches by C4 (a ¼ rate clock) inside the 4 to 2 unit. One data stream of each pair is delayed by one half cycle of the C4 clock and then multiplexed out in the next cycle. (In this example, assuming the full rate C1=6.4 GHz, then C4=1.6 GHz.) The output of each 2 to 1, i.e. DI02 and DI13 inside the 4 to 1 converter are output to the 2 to 1 data converter 240 and sampled by C2 (a ½ rate clock) clock. By the same token, one of the data streams is delayed by one half a C2 cycle and multiplexed to a multiplexer. The output of the multiplexer inside the 2 to 1 converter is then sequentially latched to four flip-flop units 106C (denoted 203 in this Figure) using a full rate clock C1. After four cycles of C1, at any given time four sequential bits are present at the output of the serializer, i.e. DO0 to DO3.

Figure 2B:
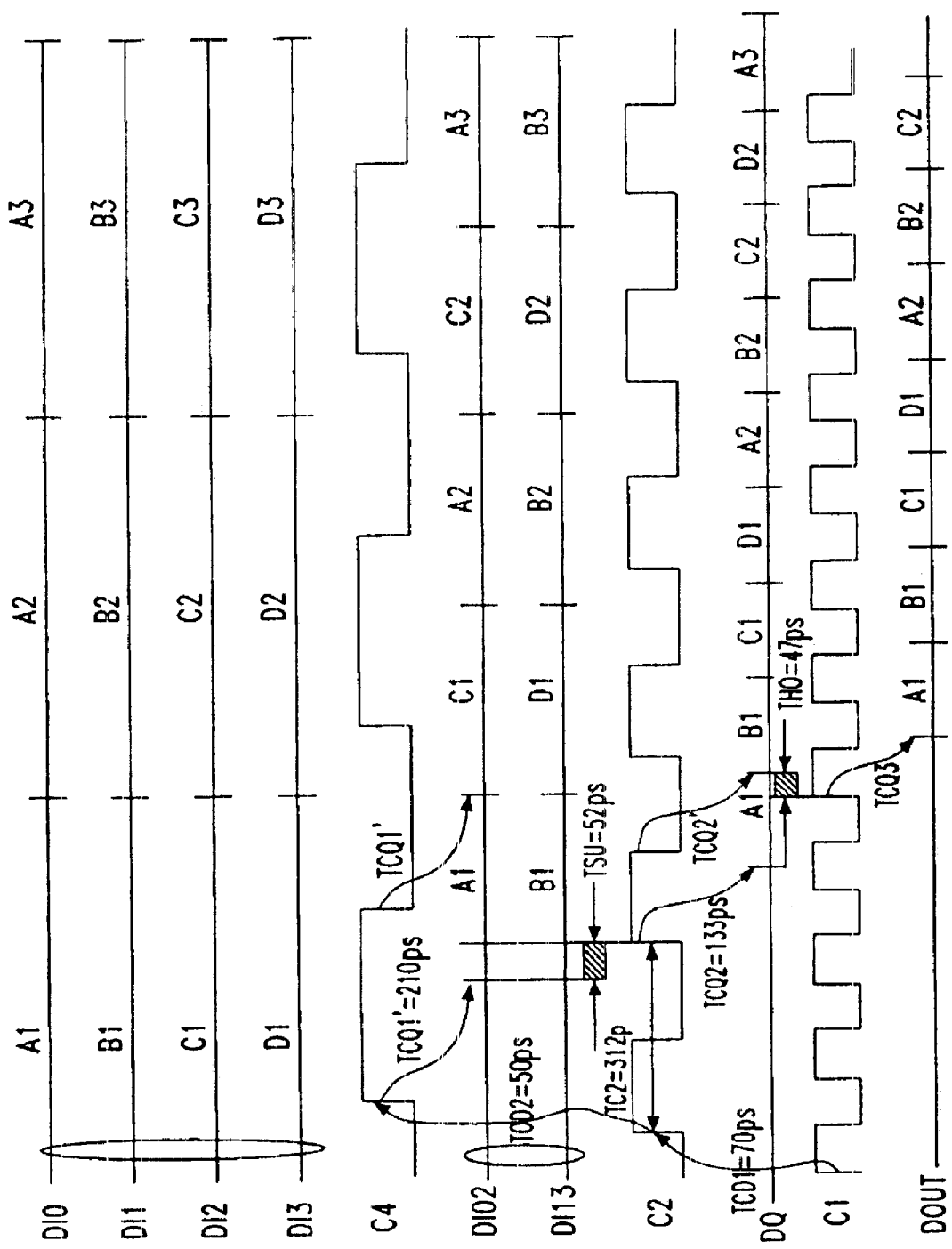
FIG. 2B shows timing relationships of the serializer.

A timing diagram of data and clock of the serialization operation is shown in FIG. 2B. The internal clock generator 204 receives a full rate clock "clk_in" signal C1 with a peak-to-peak (Vpp) amplitude of 250 mV. It is received via a clock receiver 221, and a buffer 222 to boost its Vpp height to about 400 mV. Then, the clock is converted to a ½ rate clock using a frequency divider 223 while its height Vpp is increased to about 420 mV. From there a quarter rate clock C4 is generated via another frequency divider 224 and the final Vpp height is about 520 mV. The delay between C1 to C2 (Tcd1) is about 70 ps, and the delay between C2, and C4 (Tcd2) is about 50 ps (worst case estimation). On both rising and falling edges of C4, parallel incoming data DI0 to DI3 are processed through the 4 to 2 converter. The output data to C4 clock delay (Tcq1) is about 210 ps. The setup time is thus estimated by using equation [tc2−(tcd2+tcq1)] which is about 52 ps. Similarly, at both rising and falling edges of the C2 clock, parallel intermediate data DI02, and DI13 are processed through the 2 to 1 converter. The output data to C2 clock delay (tcq2) is estimated to be about 133 ps. Therefore, the hold time (tho) allowed for the latch is estimated to be about 47 ps. Here, both setup and hold times are sufficient for the latch in this data serializer design.

A feature of this design is to provide power control to the driver. The ability to adjust the strength of the driver allows one design to cope with different situations for different applications, in particular to save power. Therefore, this design is extremely attractive for low-power applications. In FIG. 3, three control bits i.e. PWR1, PWR2 and PWR3 are used for power settings. As listed in the table, eight power levels from 0 to 23.8 mA with a 3.4 mA increment, can be set for the driver. By applying a reference voltage "VREF" to the gate of a pMOS pull-down device P0 of a current transfer unit, a predetermined reference current "Iref" is generated via a diode connected nMOS device N0. In order to map "Iref" to "Ia" by n times, where n=0 to 7, three power switch units are provided. The first switch 310 has a current mirror device N40 which is 1×(or same) size of the reference diode device N0. The second switch 320 has a current mirror device N41 which is 2×the size of the diode device N0. The third switch has a current mirror device N42 which is 4×the size of the diode device N0. The power level is then controlled by selectively switching on or off any of the three power switches. When all the switches are off (=0), the driver is shut off, and the gate of the pull down device N40 is tied to ground through device N5. At this moment, When at least one of the switches is turned on, a reference current "Ia" would be created where Ia=n1×Iref, n=0 to 7. A resulting VBIAS voltage reference will be created and input to FIG. 4 to manage the strength of the driver unit.

Figure 4:
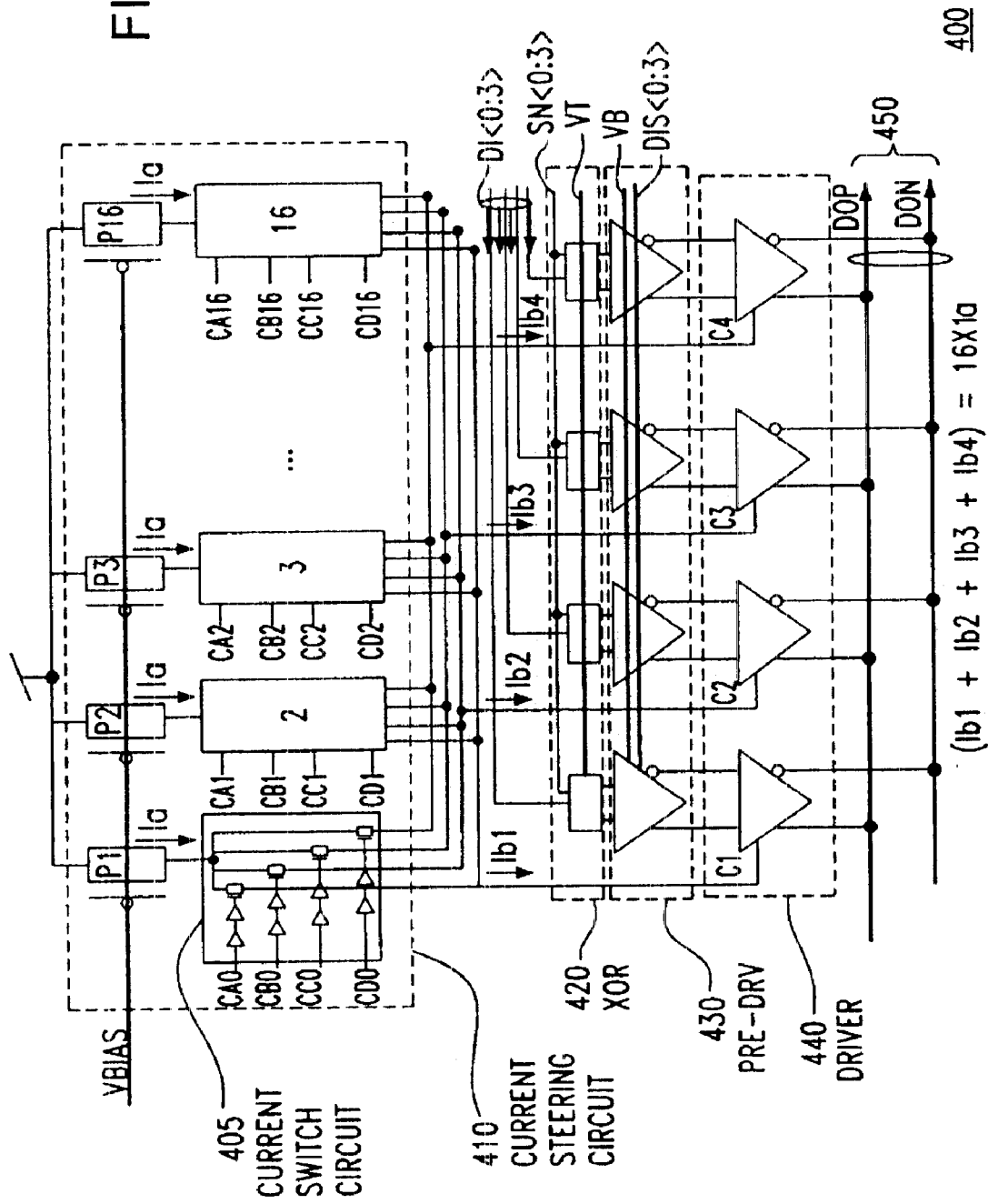
FIG. 4 shows the current steering module.

Referring to FIG. 4, the design of the current steering circuit is an advantageous feature that results in a simple programmable FIR driver design. The current steering circuit steers predetermined amounts of current to each one of the four driver blocks 109 to perform four-tap FIR pre-equalization. The amount of current (i.e. "Ib1" to "Ib4") that can be steered to each driver block in the lower half of the Figure represents the coefficient of the FIR filter for each tap. At the top of FIG. 4, the 16 current mirrors, controlled by VBIAS from FIG. 3, set the input current. In the next level, current switches 405 divides the several Ia into 1 or more of 4 branches that are wired together under control of the coefficients from generator 150 in FIG. 1.

At the bottom, Pre-drivers 430 and Drivers 440 receive the Ib as input, sum them with signs set by the DI and SN signals and send the final output on line 405.

In order to keep the total driver current constant, the sum of all the current "Ibi" must equal a constant regardless of changes to the coefficient bits during programming. There may be a programmable filter whose coefficient bits are stored in an "nxm" programmable register array discussed below. Or, a look-up table made with some sorts of volatile or non-volatile memory arrays may be used. The number of the rows "n" (=4) of the register array is determined by the number of the taps of the filter. The number of columns "m" is determined by the weight resolution of the coefficient. The higher number of "m", the finer the granularity of the weight among each taps can be set. Here, in this example, if m=16 each coefficient has at least a resolution of ¹⁄₁₆ of the total weight. In this design, 64 coefficient control bits are provided. The first 16 coefficient control bits CA1 to CA16 are used to adjust the first coefficient for the first bit. The second 16 bit CB1 to CB16 are used to adjust the second coefficient, and so on. In order to satisfy the constraint mentioned above, 16 equal sized pMOS devices P1 to P16 at the top of the Figure are used for current mirroring. Each pMOS mirror device allow a unit current of "Ia" in FIG. 4 to generate the current sum that is input to current switch circuit 405 in FIG. 4.

The output of switch 405 (IB1+IB2+IB3+IB4=16×Ia) is constant but, based on the coefficient (or weight), each individual Ibi may vary from clock to clock. For example, Ib1 is the current sum from all the first of the four branches of 16 paths. Ib2 is the current sum from all the second of the four branches of 16 paths, and so on. When the coefficient "CAi" changes from clock to clock, and Ib1 changes accordingly, and so does Ib2–Ib4. However, the coefficient will change in such a way that the over-all sum of Ibi maintains constant. Each Ibi drives a corresponding driver in driver unit 440. Depending on the polarity of each bit, a set of sign bits SN<i> are provided feeding to the corresponding XOR gates 420 to determine whether the influence form that bit is positive or negative (source or sink). All four drivers in 440 are turned on all the time, with each one has its own polarity and strength. The differential outputs of all four drivers are tied together to form output 450 (DOP and DON).

The gates of the 16 pMOS devices P1–P16 are tied together and connected to the VBIAS supply from the power select circuit block. This means, each of the 16 branches will allow the same amount of current "Ia" to flow into its corresponding current switch circuit 405. The current switch circuit 405 steers the current into at least one of the four branches controlled by 4 coefficient control bits CAi, CBi, CCi and CDi. When the control bit is set "high", the switch is on to let at least a portion of current Ia flow through. If only one of the four control bits is activated, then all the current Ia will flow through that branch. If two control bits are simultaneously on, then only ½ of the current Ia will flow into two branches which are turned on. This will guarantee that at any moment, regardless of the coefficient control bits settings, the total current used to drive the set of drivers 440 is constant, or 16×Ia. The total current being constant means the driver consumes constant power, which reduces noise. The output 450 varies according to the operation of the FIR, that is the amplitude of each signal depends on the adjacent bit pattern (before and after). With this design, a minimal resolution of 1/64 of the total current can be achieved. That is, if only one (e.g. CAi) of the four control bits (CAi, CBi, CCi and Cdi) of all the current switches 405 are switched on, the whole amount of 16×current Ia will be used to drive one driver (C1). If more than one of the four control bits are switched on, then portion of Ia will be used to drive the other three drivers. One can set up a table, so that each time a minimum adjustment on the current amount Ibi will be 1/64. Thus, one of the drivers can be incremented (or decremented) by 1/64 amount of current when a single bit is changed. In practice, one would like to keep the resolution lower than 1/32 to keep the control logic design simple.

However, if two control bits within each switch circuit are allowed to be switched on, then the resolution becomes 1/32 of the total current. The higher the resolution, the less the disturbance will impart to the driver during programming. But, the cost will be the design complexity of the coefficient generator. All the n'th (n=1 to 4) branches from each switch block are shorted together and connected to the n'th driver. Assuming that the first bit is the main bit, if we want to shut off the equalizer, we use only the first driver which is the main bit driver. We will set coefficients so that all Cbi, Cci and Cdi are zero, and no pre-equalization is triggered, then all the 16 CAi bits are set high while the remaining bits are "low". All the current (16×Ia) would be used to drive the first driver via C1. However, if besides CAi some of the CBi, CCi and CDi are set high, the rest of the bits are used for pre-equalization excluding the main bit. The total current will be distributed to Ci (i=1 to 4) to drive four drivers based on the coefficient setting. Four sets of driver units are used. Each takes data from the corresponding data bits DI<0:3> from block 106 in FIG. 1. Four sign control bits "SN<0:3>" are used to set the sign of each coefficient. This would provide flexibility for the coefficient of each bit to change sign, so that the pre-equalization can have a pre-emphasis, or de-emphasis effect. The sign changing is conducted by using a set of XOR devices 420 with a reference voltage VT. A set of four pre-drivers 430 are used to pre-amplify the signals before each corresponding driver 440.

In order to minimize the residual FIR effect, the pre-drivers are equipped with an individual disable signal "DIS<0:3>" sent from a system controller. When one or more driver components of the reference bits are not activated for the FIR operation, a low level of residual (leakage) current flowing in these components would cause a detrimental effect to the signal. In other words, this residual current may conduct an undesirable de-emphasis which would enhance signal degradation especially when inter-symbol interference is present. Four bits of data output from serializer DI<0:3> (block 106 in FIG. 1) become the input data for the driver. Each data bit is fed to its respective XOR component 420, pre-driver 430 and main driver 440. At the end, four pairs of differential output signals from four drivers are joined to form the final pair of output signals, DOP and DON 450. The summed current Ibi is fed to each driver to determine the strength of that driver. The sign bit SN<0:3> can be set such that data pre-equalization can be either a pre-emphasis or de-emphasis. The disable pins are used to disconnect any driver component which is inactive to avoid residual FIR problem.

Control signals DI, SN and DIS are sent from a logic control block that is part of the overall system. The logic is prestored with SN, the sign bit, based on an initial setting of the FIR transmitter. The DI are incoming data, sent in parallel form, e. g. on a 32 bit wide bus (or 16 bits, etc). The data are then serialized in the serializer. The DIS is the disable signal also from logic control, e.g. when all the signals are sent, logic shuts down the FIR block to save power till next batch of data are ready.

Figure 5:
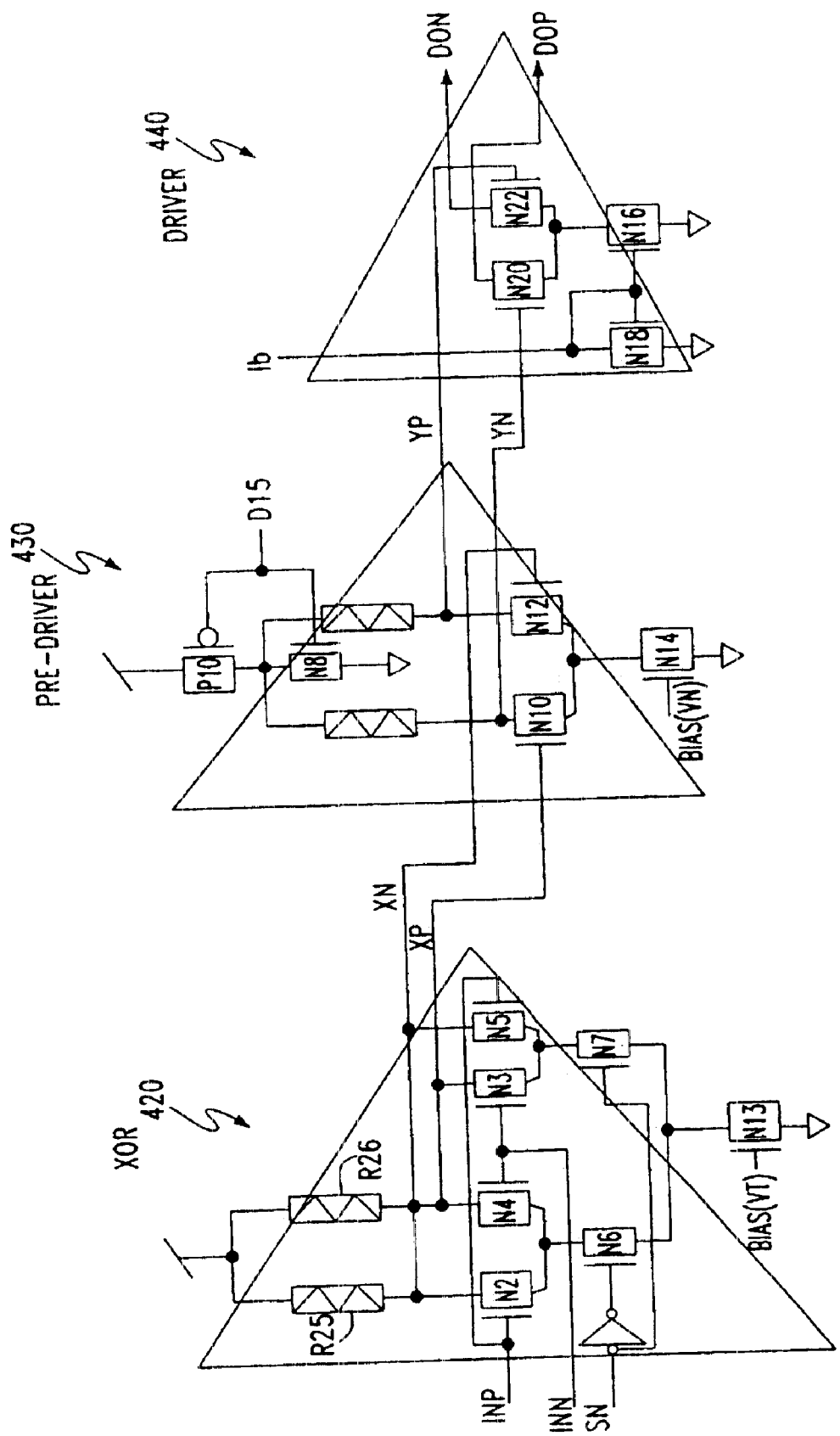
FIG. 5 shows the driver portion of FIG. 4.
Figure 6A:
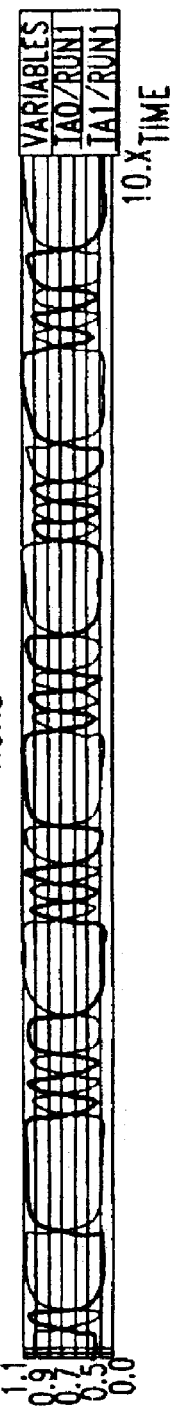
FIGS. 6a–6e shows the effect on a waveform of various coefficient values.
Figure 6B:
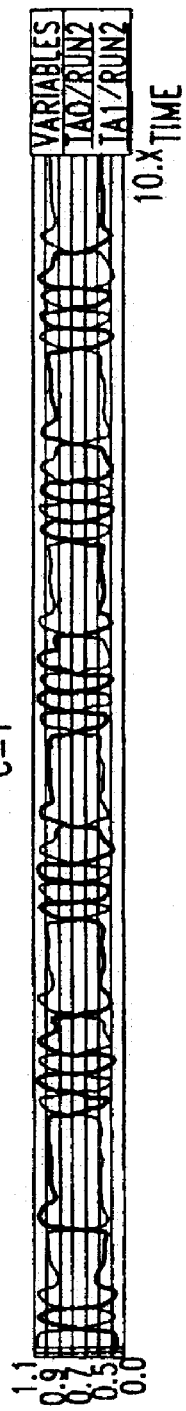
Figure 6C:
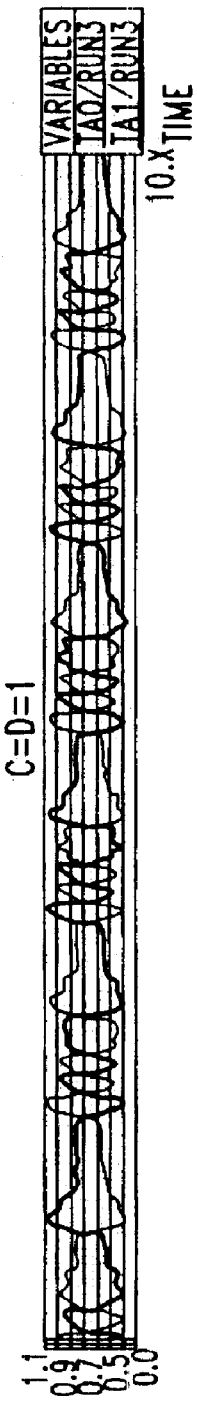
Figure 6D:
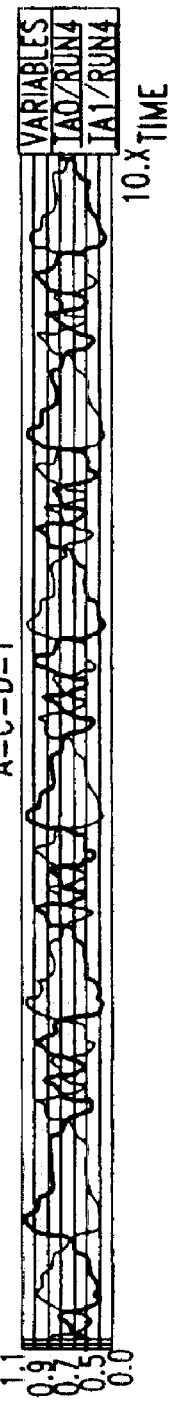
Figure 6E:

One example of the circuit schematic for the XOR, pre-driver and driver is illustrated FIG. 5, where pre-driver 520 corresponds to predriver 430 in FIG. 4 and 530 corresponds to 440.

The XOR device 420 is controlled by the sign control bit SN. When SN=0, there ; is no sign changing, that is, the polarity of input and output is identical. Otherwise, SN=1, the polarity is opposite.

A bias voltage VT is applied to the XOR circuit. The preamp 430 is equipped with a disable device formed by a pMOS P10 and nMOS N8 with gates tied together to a DIS control pin. When the driver is not active, or all the 16 coefficient control pins are at logic "0", the pre-amp is shut off by triggering the DIS control. Finally, the driver device is formed by two input devices N20 and N22, one tail device N16 and one mirror diode device N18. The reference current Ib is fed to N18 which is proportionally mapped to the tail device, N16 which is DC biased to sink the common source of N20 and N22) device by their size ratio. If N16 has a size which is 8 times (in width) the diode device, then the current that mirrors to the tail device will be 8×Ib. In order to save layout area, the size of the drivers in FIG. 4 are made slightly different. The first two drivers are prepared mainly for the main bit and therefore would have a full size of input device. The last two drivers are prepared for the reference bits, and therefore they would rarely be used at their full capacity. For this reason, the size of these input devices can be reduced.

The total current mirrored to the driver system remains constant regardless of the combination of the 64 coefficient control bits. The result of this structure is that noise is reduced. Since noise consumes power and jeopardizes the quality of the transmitter as well as near end receiver due to cross-talk, this is a benefit of the invention. Another advantage of this design is the flexibility to form a program-on-the-fly FIR filter. Any bit can be pre-designated as the main bit, having associated previous reference bit(s), which are determined by data bits earlier in time than the main bit. For example, consider four bits b1, b2, b3, and b4 at time (t). If b2 is selected as the main bit, then the information collected from b2 and b3 will serve as the post cursors, and the information collected from b1 serves as the precursor, all of which modify the signal shape of the main bit b2. At next clock cycle, or time (t+1), b4 is gone, b1 becomes the main bit and a new b0 will be the new precursor, and b2 and b3 will be the new post cursor used to modify the signal shape of the new main bit b1, and so on as the serialized data make their way down the transmission line. The sign (SN) for the post cursor bit is set to be negative, the sign for the precursor bit is positive so to pre-emphasize the main bit) to combat the attenuation due to media. Another advantage of this design is that the bit number (n) as well as the resolution of the weight (m) can be made adjustable or growable such that design changes including schematic and physical layout become transparent.

Simulation results of different degrees of pre-emphasis are displayed in FIG. 6, showing that a FIR driver according to the invention has the capability to manipulate the signal to pre-emphasize, or pre-distort the waveforms.

The distortion is chosen such that the waveform shapes at the destination are acceptable to the receiving circuit, so that after they are transmitted along the transmission line and packaging components, the waveform will be restored at the destination. In case (A), no FIR tap is set, and single bit signals suffer loss due to attenuation in the media. In case (B), we set one of the first post bits to high, a significant improvement on ISI is observed. In case (C), we set one of the first and one of the second post bits to high. In case (D), we set one of two post bits and one of the previous bit to high. In case (E), we set two of the first previous bits and a post bit, and one of the second previous bit to high. It appears that the resolution of the reference bit in this example is not fine enough.

Figure 7A:
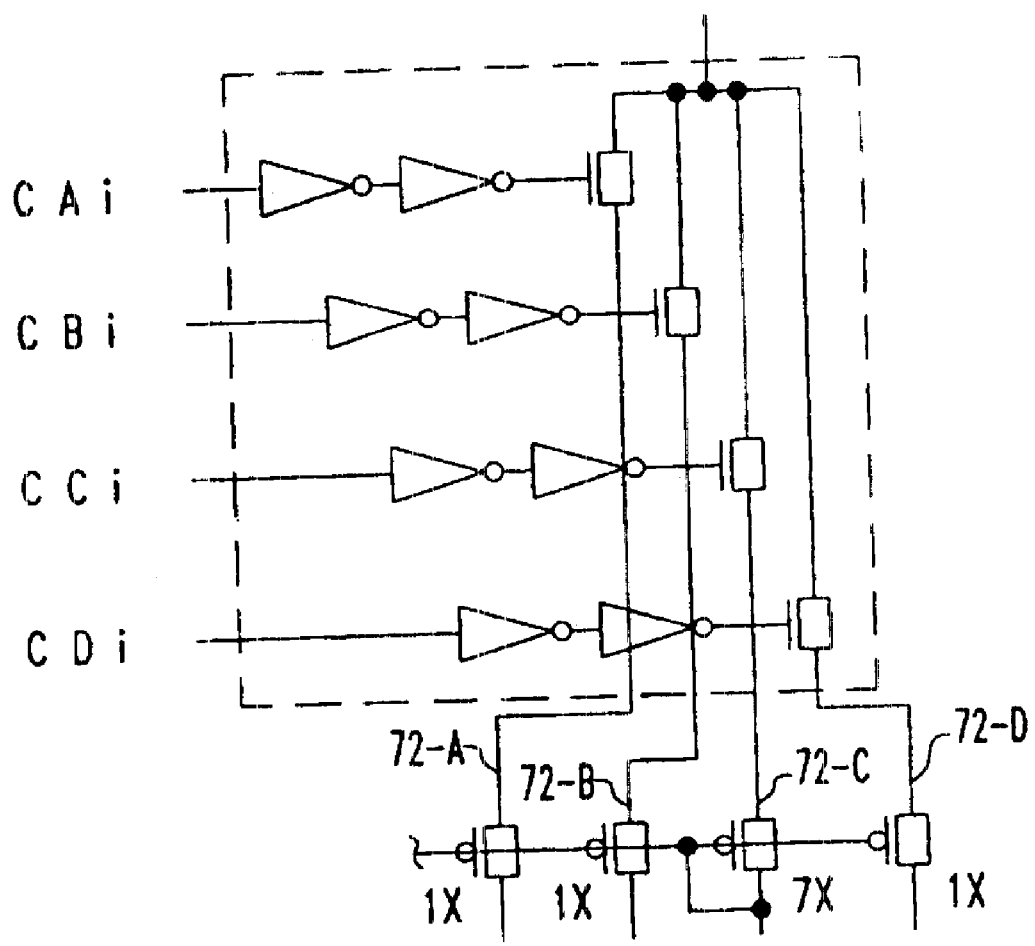
FIG. 7A shows a portion of the current steering module.

Referring to FIG. 7, one way to increase the resolution of the coefficient of the reference bit can be done by modifying the SWITCH component of the steering circuit 405 of FIG. 4 as shown in FIG. 7A. By inserting different sized pMOS devices 72-A, 72-B, 72-C and 72-D for each branch, one can control the amount of current flow through each branch, e.g. by controlling the amount of current flow to establish the coefficient of the main bit. It has nx (e.g. n=7, or any proper number) weight than those of the reference bits, therefore, we can size the pMOS devices to determine the current ratio between the main and reference bits. Here, the total current flow for each branch is still kept constant. If switches to the reference bits are turned on, the current through the main branch will be n times that through the reference branch.

Figure 7B:
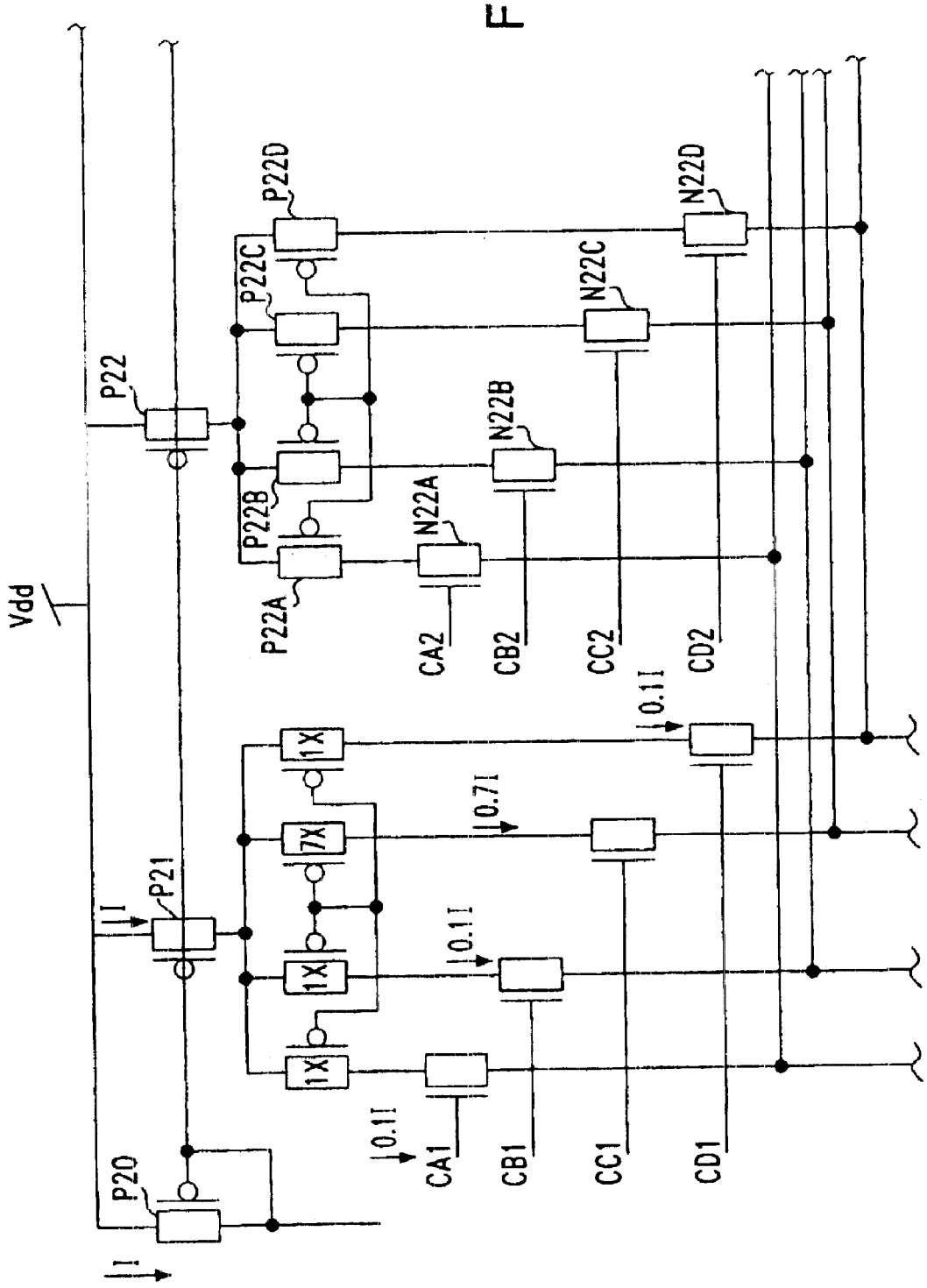
FIG. 7B shows an alternative version of the current steering module of FIG. 7A.

A preferred approach is illustrated in FIG. 7B. Each branch consists of a current source pMOS device P22, a ratio circuit formed by four pMOS devices, P22A, P22B, P22C and P22D having gates controlled by a conventional bias circuit.

The ratio circuit is used to determine the current ratio that flows through each path of the branch, if that path is switched on by the corresponding switches formed by four nMOS devices, N22A, N22B, N22C and N22D. The coefficient switch control signals CAi, CBi, CCi and CDi are used to switch on or off the path of each branch. Placing the current ratio circuit on top of the switch circuit will ensure the accuracy of the current flow within each branch. The unit current that is mapped from the P20 mirror device will be distributed among the path. Unlike the first proposal, the gate to source voltage Vgs of all ratio devices are not subjected to change by the switch devices. Also shown in FIG. 7B, the first path of each branch are tied together to form tap coefficients of the first reference bit. The coefficients of the second reference bit, the main bit and the last reference bit are formed in a similar way. Using this approach, we have a finer tuning capability on the FIR coefficients. Finer tuning is important, since without adequate resolution, the benefits of a programmable FIR are not realized.

Figure 8:
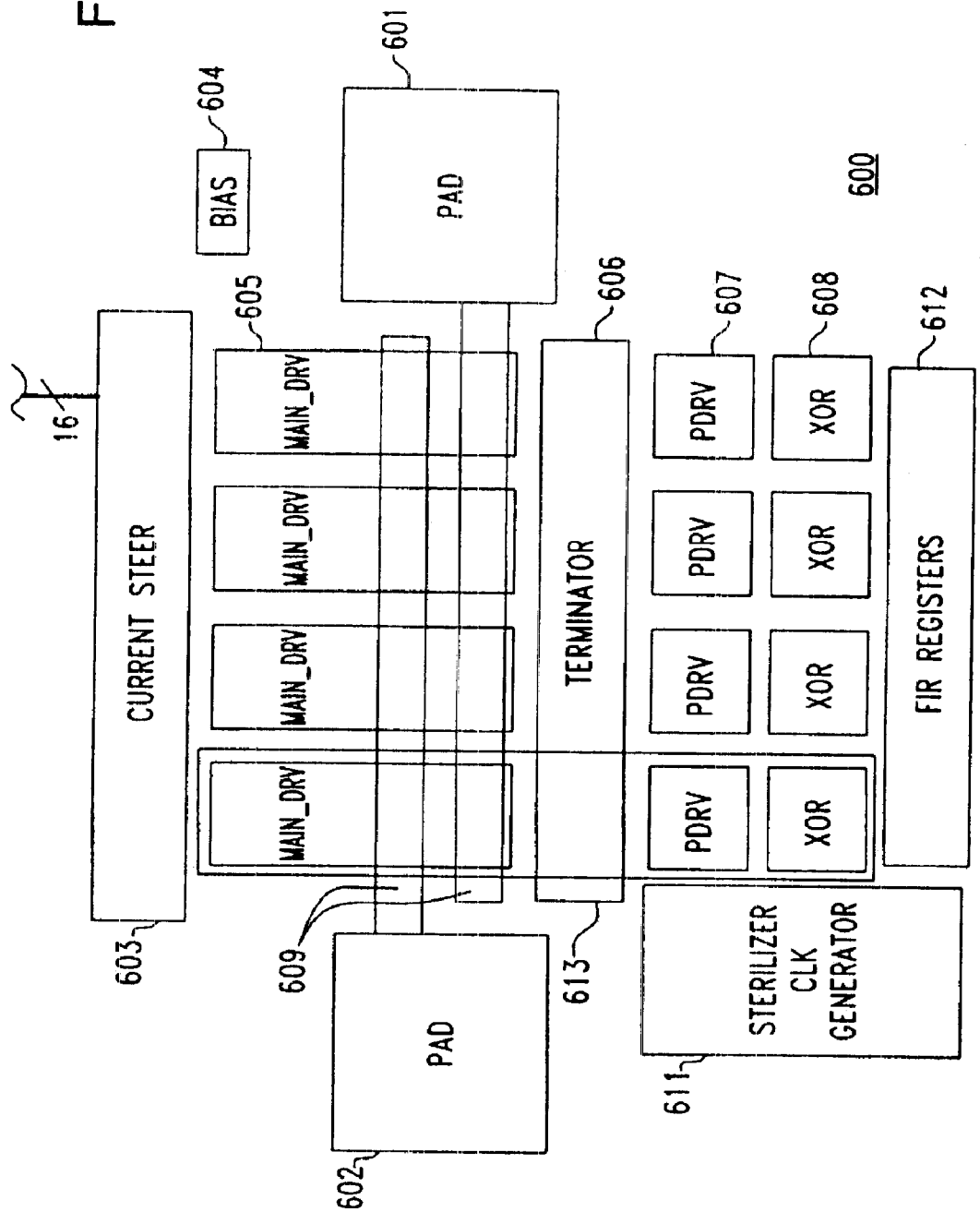
FIG. 8 shows a plan view of a layout scheme.
Figure 9:
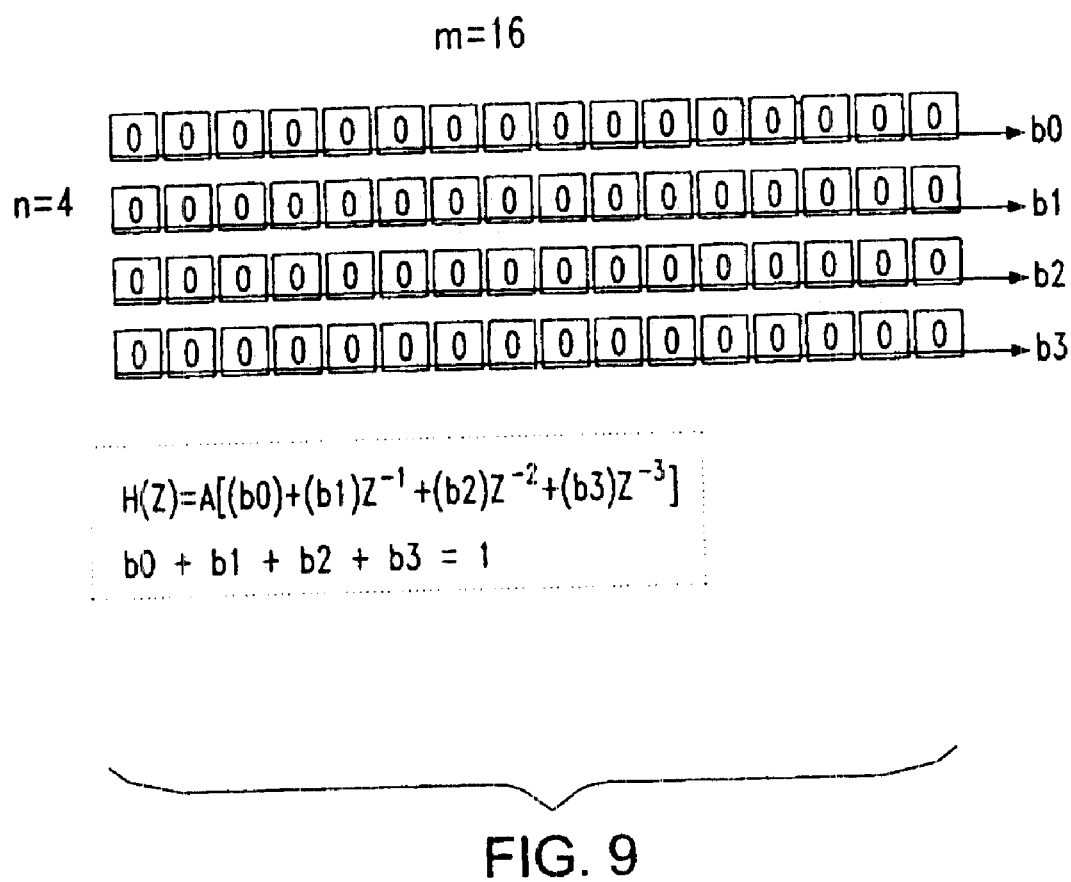
FIG. 9 shows an overall view of a coefficient register.

A layout example of the programmable FIR driver circuit is illustrated in FIG. 8. The four-tap FIR filter driver comprises four slices of driver units 613 including parts of XOR block 608, a predriver block 607, and a main driver block 605. The main driver blocks are located in between two pads 601, 602 so that output signal pair 609 will have the shortest distance to the pad, which significantly reduces the parasitic wiring capacitance. The driver units are powered by the current steering unit 603 which has 64 coefficient control bits 614 from a control block 150 in FIG. 1. A bias unit 604 is used to provide bias to the driver and peripheral circuits. The serializer, clock generator 611 and FIR registers 612 are located adjacent to the XOR block to avoid latency.

COEFFICIENT GENERATION A 4×16 thermometric coding register array that is used to generate the coefficients to the FIR unit in FIG. 1 is shown in FIG. 8. (The term "thermometricis" conventional and indicates a register in which there is a block of "1"s and "0"s, with changes allowed only at the border or interface between the 1 and 0.) It will be evident to those skilled in the art that based on the same concept and spirit, any reasonable size of the array can be built. Before programming, all the cells of the array are preset to "zero", so to erase all the residual data in the array. The transfer function of a FIR type (pre-emphasis) filter demonstrated below is based on an assumption that the first bit is the main bit, the next three are the previous bits (precursor). The coefficients that have been generated for each bit, b0 to b3 are stored in the corresponding row of the array. The formula gives an output of a circuit controlled by the register. Here, "A" is the scaling factor which is predetermined based on each specific application for minimum power consumption. The sum of all the coefficient equals to unity (or some other constant) to ensure that driver current is maintained at a constant preset level and doesn't affect by the programming. In order to gain some programming resolution (m=) 16 bits are provided. This means each bit represents $\frac{1}{16}$ of the total weight. For example, we can set 12 bits on the first row to "high" and 4 bits on the second row to "high", then the coefficient weight of the first row (bit) b0 is ($\frac{12}{16}$=) and the second row (bit) b1 is ($\frac{4}{16}$=) 0.25. The total weight is "1".

In this example, we set the first bit as the main bit, so that the next three bits are all post cursors, and there is no precursor. Since the first row of the register controls the main bit (or tap) of the FIR, the second step shown in FIG. 10 is to set all 16 cells of main bit to "1", so that it (driver c1 in FIG. 4) has the full strength. If nothing is done after this, the driver will act like a normal driver without pre-emphasis. However, if we want to have a two tap equalization effect, as shown in step-3, at least one bit in the second row will be set to "1" (here we have the first 4 bits set to "1"). Here, the "1"s in the first row at the same column are swapped with "0" in the second row, so that the resolution is $\frac{1}{16}$th.

Now, if two taps are not satisfactory for equalization, a third tap can be used as shown in step 4 by swapping at least one bit containing "1" in (here we have 2 bits) in the second row with "0" that of the third row at the same column. Similarly, a fourth tap can be activated as shown in step 5. The programming is dictated by employing conventional algorithms, such as those illustrated in FIG. 11.

To optimize the link performance with a high convergence rate. Once the programming is done, the information including which tap and how much weight of tap are needed to be modified are sent to a controller (not shown) to initiate coefficient update inside the thermometric register. Therefore, the following discusses the design of a nxm thermometric code register array to generate coefficients for a programmable filter. The register would allow internal code (the term code in this context is short hand for coefficient setting numbers) swapping in such a way that the total sum of the coefficients remain unity (or some other constant).

Another object of the invention is to receive the code swapping information from a controller circuit to facilitate a sequential code swapping operation. For example, when an increment command signal of a certain row is received, it increments the thermometer code of that row and simultaneously decrements the code of the next row.

One more object is to provide a flexible design so that the transfer function can be adjusted by designating any row of the register as the main bit, so that both precursor and post-cursor equalization can be accommodated. The result is a flexible method and design to receive a set of commands from a controller and perform coefficient updates for a programmable filter. If we choose the first row as the main bit, then there will be no precursor, and we have three post cursors. If we choose the second row as the main bit, then we have one precursor, and two post cursors.

In transmitting a signal bit, its waveform is influenced by the bit previous to it, and also the bit after it. For example, consider transmitting a long stream of "1"s, then a signal "0" then another long stream of "1"s. Due to ISI (inter-symbol-interference) the signal "0" will be much worse than if one were transmitting a long stream of "0". Using FIR, we can "see" bits before the current bit and bits after the current bit. In the case of a situation like 11111011111, we will definitely want to boost that zero bit. We can accomplish this by suppressing the adjacent "1"s that abut the "0", so as to reduce interference. Therefore, when we say we use a four tap FIR, that means we slide a window of four bits and examine the bits before and after the current bit. With post-cursor bits, you can reduce the strength of the "1"s gradually as they approach the current bit. Using the pre-cursor, you can boost the strength of the next 1 so that you have more difference between a current 0 and the following "1".

Figure 11:
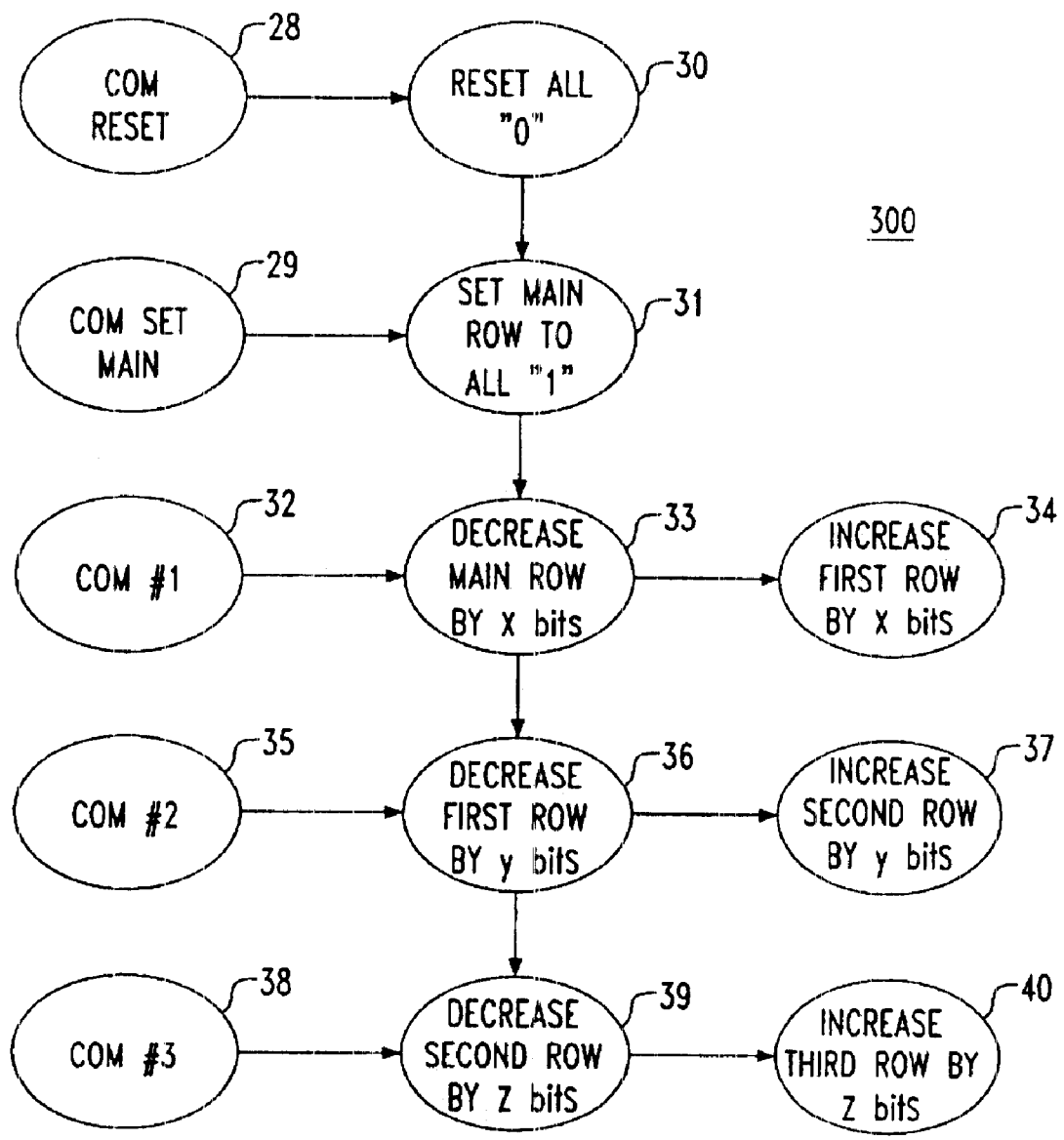
FIG. 11 shows steps in the process of moving coefficients.

To help in understanding the concept of the invention, a flow-chart is provided in FIG. 11. This flow chart 300 describes the code updating sequence of the register array.

Initially (step 30), all the cells are reset to "0" to clear up the memory when receiving a reset command 28. Then, a set main array command 29 will point to which row is the main bit and the content of this main bit row will be all set to "1". Upon receiving command #1 32, the coefficients of first row 33 and second row 34 are programmed simultaneously. That is, applying a decrement of the first row by "x" bits and automatically incrementing the second row by "x" bits. It is understood that it will take at least "x" cycles to finish this update. Upon receiving command #2 (35), the coefficients of second row (36) and third row (37) are programmed simultaneously. That is, applying a decrement in the second row by "y" bits and automatically an increment in the third row by "y" bits. Similarly, it will take at least "y" cycles to finish this update.

Upon receiving command #3 (38), the coefficients of the third row (39) and forth row (40) are set simultaneously. That is, applying a decrement of the third row by "z" bits and automatically incrementing the forth row by "z" bits. It will take at least "z" cycles to finish this update. Preferably, the controller circuit keeps track of the number of the updated bits so that updating will proceed smoothly without violation, e.g. y<x, z<y, etc. However, even without a tracking device, the update will still proceed without a problem. For example, if y>x occurs, then second row can only be updated with x bits. There is no harm done in this case.

Figure 12:
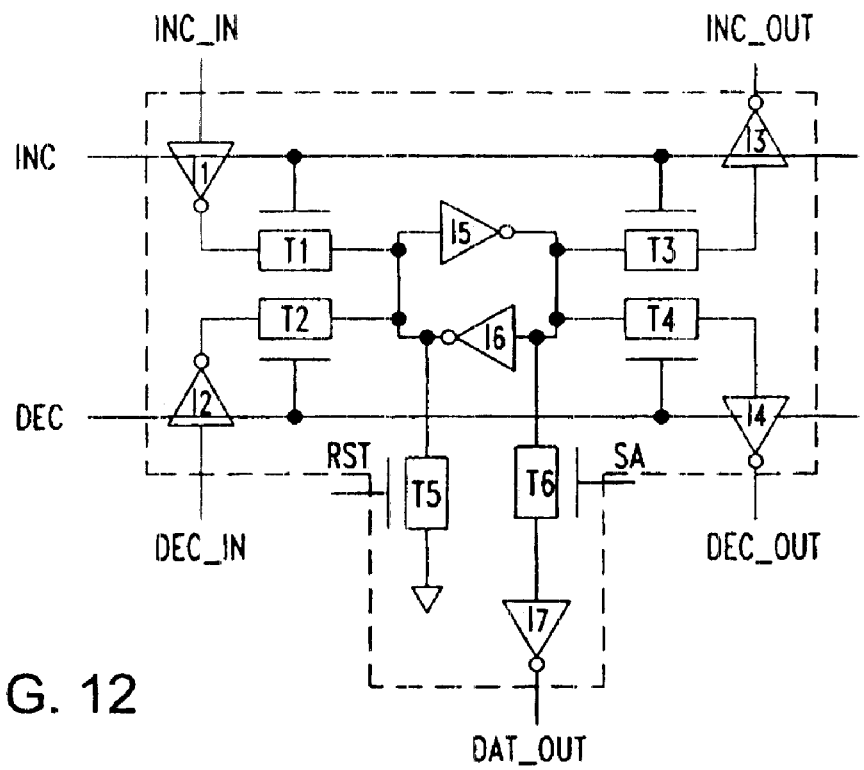
FIG. 12 shows an individual cell in the register.

A cell structure of the thermometric code register is illustrated in FIG. 12. A memory latch is formed by a pair inverter 15 and 16 connected back-to-back. Or, a cell is basically a six-port SRAM comprising: (1) a first input (write) port to receiver data from INC_IN, (2) a second input (write) port to receive data from DEC_IN. (3) a third input (write) port to reset the storage node, and (4) a first output (read) port to send data out to INC_OUT, (4) a second output (read) port to send data to DEC_OUT, and (6) a third output (read) node to send data to DAT_OUT. Since all the incoming and out going data are inverted, except the one reset to ground, inverters I1, I2, I3, I4, and I7 are needed to change the bit polarity. Control signals from the controller circuit are, INC for incrementing, DEC for decrementing, RST for reset, and SA for data sampling when codes are updated. These control signals are shared by all the bits of the row.

Figure 13:
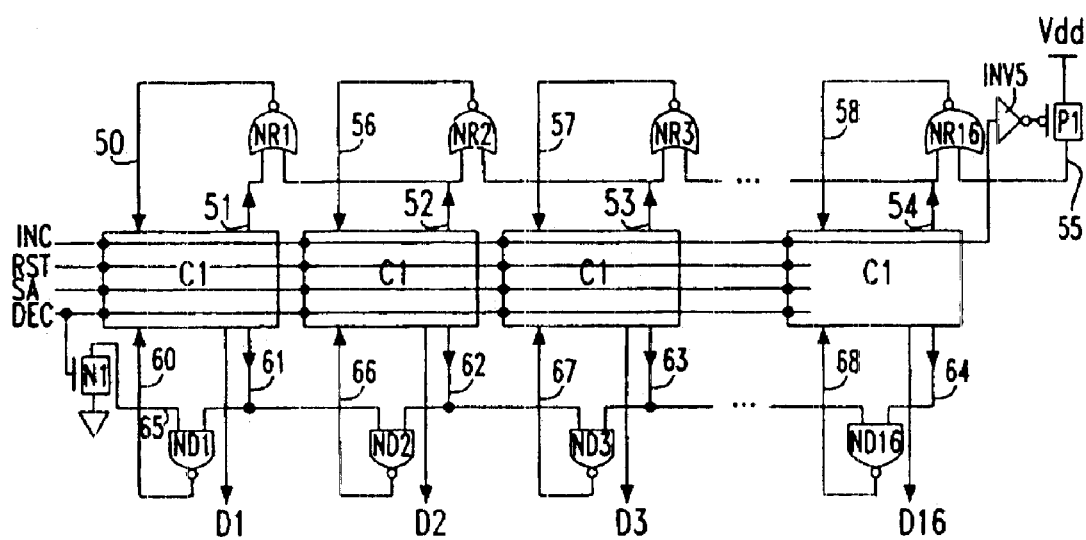
FIG. 13 shows control circuitry in the register.

A 16-bit thermometric code register can be built by connecting 16 cells in a row as shown in FIG. 13. Except for two end cells, all the 14 internal cells are interconnected identically. An advantageous feature of this design is that the cells are in a modular form. One can connect any arbitrary number of cells to form a row. This design fits well with an ASIC library environment, i.e. the array is "growable". The left end cell C1 comprises a NOR gate NR1 which receives first input "INC_OUT" 51 from C1 cell and second input the "INC_OUT" port 52 C2 cell. The output of the NOR gate is fed to INC_IN port 50 of the C1 cell. It further comprises a NAND gate ND1 which receives a first input 61 from DEC_OUT 61 from the cell C1 and second input from a pull down device N1 65 and creates an output 60 which is sent to an input port DEC_IN of cell 1. The left end cell C1 comprises a NOR gate NR1 which receives first input "INC_OUT" 51 from C1 cell and second input the "IN_OUT" port 52 from C2 cell. The output of the NOR gate is fed to IN_CIN port 50 of the C1 cell. It further comprises a NAND gate ND1 which receives a first input 61 from DEC_OUT 61 from the cell C1 and second input from a pull down device N1 65 and creates an output 60 which is sent to an input port DEC_IN of cell 1. Any of the middle cell C2 to C15 comprises a NOR gate and NAND gate. Here both inputs of the NOR from port of "INC_OUT" of current and neighbor cell on the right. The output of the NOR gate is fed to INC_IN port of the current cell.

Both inputs of the NAND gate are from DEC_OUT of current and neighbor to the right. NAND gate ND2 has input from 62 DEC_OUT of current) and 61 (DEC_OUT of neighbor. NR2 has input from 52 and 53. The output of the NAND is sent to an input port DEC_IN port of the current cell. Four control pins INC, RST, SA and DEC are shared by the cells in the same row. When an INC command is received, the content of two adjacent cells are "NORed". Since there is an inverter installed at the output of the NOR inside each cell, the function is actually "OR" logic. If all bits are preset to "1", increment will do nothing to the cell, since "1" OR "1" is still "1". However, if some bits are "0", then the OR gate will change the first "0" bit that abuts to a "1" bit to a "1" by the normal operation of an OR gate when an increment command is received. The values of the other bits will be unchanged, since "1 OR 1=1", and "0 OR 0=0". On the other hand, when a decrement command is received, and if all the bits are set to "1", the left end cell C1 will be converted to "0" by logic "1 AND 0=0". Here, the first zero is introduced by the pull down nMOS device N1 when DEC command is activated. The content of the rest cells are not changed since "1 AND 1=1". If some bits in the row are "0" and the rest are "1", when DEC is activated, the content of the first "1" cell that abut to the "0" cell will be converted to "0" by the AND gate. The NAND gate plus an inverter is an AND gate, where the inverter resides in each cell. If all cells are "0" and a INC command is issued, the right end bit will be converted from "0" to "1" since the pull-up pMOS device P1 is on and "0 OR 1=1" and thus the first bit on the far right will have "1" stored in the cell. When all the programming is done, a SA control will dump all the contents from each cell to the filter via D1, D2, . . . D16. Or, when a RST command is received by the register, all the cells will be reset to "0".

Figure 14:
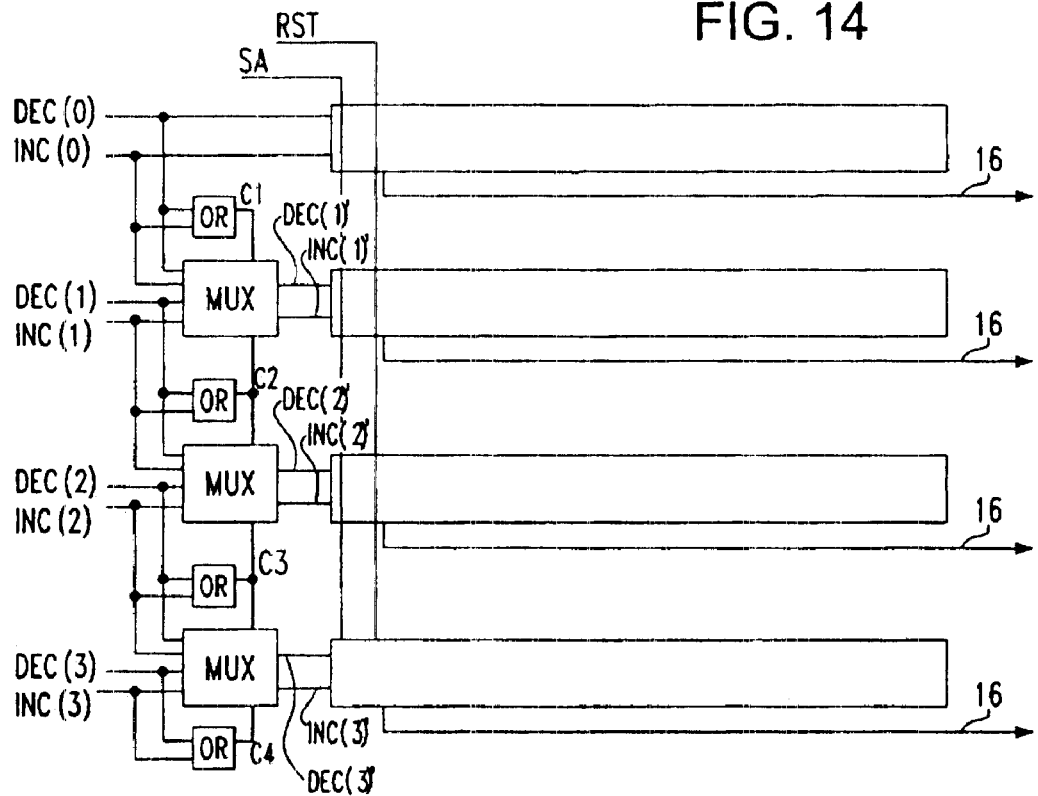
FIG. 14 shows a block diagram of the register.

The advantage of the register design is that it is flexible, modularized, and that less control bits are required. Further, no address bits are required. In order to form a two dimensional thermometric code register at least two rows are formed in an array. In the example shown in FIG. 14, we have four rows in the array to fulfill four-tap FIR filter equalization. The RST and SA control pins are shared among the rows. Each row must have its own DEC and INC control so that they can proceed with coefficient programming independently. Here, DEC(i) and INC(i) are the increment and decrement command pins for the "i-th" row. Assuming that first row is used for setting the main bit, therefore the content of the cells of this row will be precharged to all "1". The second row will take command signal DEC(1)'INC(1)' either from DEC(0), INC(0), or DEC(1), INC(1) depending on two internally generated signals "C1" and "C2". If the first row is asked to decrement or increment, then C1 will be "high" and DEC(1)'=INC(0), and INC(1)'= DEC(0) by a MUX. This means, when the first row is incremented, the second row would automatically decrement, and vice versa. Thus, the auxiliary register means automatically increased the (n+1)th row when the nth row is decremented. This lrule applies to any of the following adjacent rows.

Figure 15:
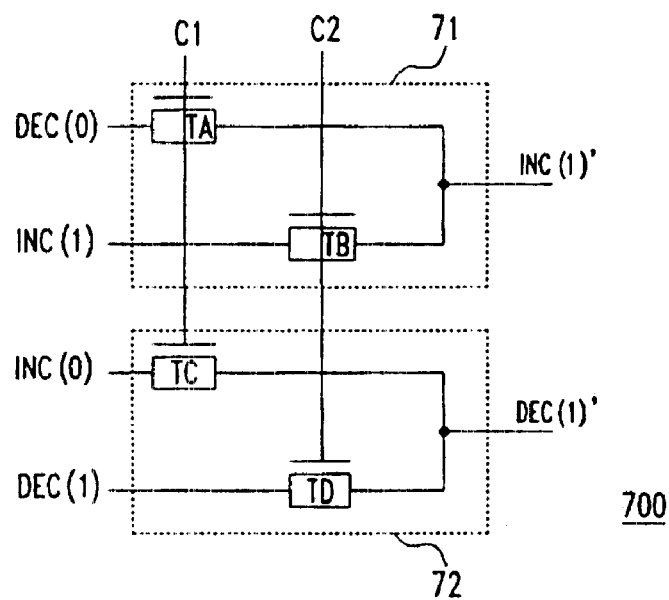
FIG. 15 shows a multiplexer for use with the embodiment of FIG. 14.

The net is to propagate the thermometric code (the data in the register) in two-dimensional form while keeping the sum of all the coefficient to unity. In other words, the total number of cells that has logic "1" is always 16 within the array. A simple multiplexer circuit is shown in FIG. 15. This feature is useful for a high-speed driver design to ensure that power consumption of the driver is maintained precisely at design target, and is not affected by the coefficient change. The 16 outputs are sent to the driver upon receiving the SA control signal. This means that the driver will not be disturbed during programming to avoid unnecessary glitch noise. To expand the idea, one can provide more granularity while changing the coefficients. The example mentioned above has a resolution of $\frac{1}{16}$ for each increment or decrement.

To have $\frac{1}{32}$, or higher resolution, in this design we can have two or more coefficient to set to "1". As shown in FIG. 16A, initially we can preset row A, B, C and D to a desirable initial condition (e.g. zone X and zone Y have 2 bits per column. Here, the coefficients of the main bit are stored in row B, while row A is for the future bit coefficients and row C and D are for two previous bits. Coefficients in each row A are gathered in a specific zone. For example, coefficients in row A are gathered in zone Z. Intentionally, gaps are prepared in between each zone, such as X-Y, and Y-Z, etc. The purpose of this arrangement is to avoid having more than two bits in each column set high.

Since the control such as swapping the bits are done via a logic control block (not shown here), it is preferable for the highest speed that we have a predefined zone and gap so that hard wiring can be done between logic control and the register. However, we may also use software to perform such control so that there will always have only two bits in a column switched high. In this example, for the sake of simplicity we envision a hardware control block, so that between zone x and y, there is a pre-set gap x-y, and between zone y and z a gap y-z. We swap x (C bit) and y (D bit) using gap X-Y. For example, in FIG. 16B, increase C by $\frac{1}{32}$ and decrease D bit $\frac{1}{32}$, so we extend C from zone X into zone X-Y, and shrink D in the Y zone. This is a simple example for ease in implementation and there may be many more alternatives.

More specifically, each increment or decrement of each row would allow exactly $\frac{1}{32}$ (i.e. ½ of 16, or 0.5) unit for adjustment. As shown in FIG. 16B, after one increment of row A, (value increased from 4 to 4.5), one increment of row C (value is increased from 1.5 to 2) and one decrement of row D (value is decreased from 1 to 0.5). The resulting main bit will have a coefficient weight change from 9.5 to 9.0, even if the coefficient of main bit didn't change in this example. This 2× resolution can be carried out in a simple manner, that is each row is handled independently, with no need of the MUX circuit shown in FIG. 15. The design and operation are both easier. We also leave the coefficients of the main bit in row B untouched. It will be evident to those skilled in the art that based on the same spirit, there will be many combinations to program the coefficients with various degrees of resolution.

While the invention has been described in terms of a single preferred embodiment, those skilled in the art will recognize that the invention can be practiced in various versions within the spirit and scope of the following claims.

What is claimed is:

1. A driver system for transmitting data along a transmission line comprising:
   means for sending a stream of data signals sequentially along said transmission line;
   adjustment means for adjusting the amplitude of each data signal, in which the strength is represented by a set of coefficients that add to a reference number.

2. A system according to claim 1, in which the amplitude of a signal is adjusted by adding a controllable number of current sources together while the sum of all current sources remains constant.

3. A system according to claim 2, in which a set of reference currents is summed to increase or decrease the output current.

4. A system according to claim 3, in which a set of m reference currents is each divided into n parallel paths under control of stored coefficient data and the current in the n paths is directed under control of stored sign data to a set of n current drivers to increase or decrease the output current, so that the sum of all current sources remains constant while the sum of the output currents from the current drivers changes.

5. A system according to claim 4, in which said set of stored coefficient data is manipulated by auxiliary register means in a register having at least n rows and m columns, said auxiliary register means having means for maintaining the sum of said coefficient data at a constant reference sum.

6. A system according to claim 5, in which said auxiliary register means includes means for decrementing a main row by a first decrement number of bits and for automatically incrementing a corresponding number of bits in a first supplementary row.

7. A system according to claim 6, in which said auxiliary register means includes means for decrementing said first supplementary row by a second decrement number of bits and for automatically incrementing a corresponding number of bits in a second supplementary row.

8. A system according to claim 5, in which said rows comprises a row set of cells, a first cell, a last cell and a set of identical intermediate cells, whereby said register may be expanded by adding additional intermediate cells.

9. A system according to claim 8, in which said auxiliary register means includes means for changing, in response to a decrement command applied to said row set of cells, the first cell containing a logic zero state to a logic one state.

10. A system according to claim 9, in which said auxiliary register means includes means for changing, in response to an increment command applied to said row set of cells, the first cell containing a logic zero state that follows a set of cells containing a logic one state.

11. A driver system for transmitting data along a transmission line comprising:

means for sending a stream of data signals sequentially along said transmission line;

adjustment means for adjusting the output amplitude of each data signal such that the amplitude at the end of said transmission line is substantially the same as a standard amplitude, in which the output amplitude is represented by a set of coefficients that add to a reference number.

12. A system according to claim 11, in which the amplitude of a signal is adjusted by adding a controllable number of current sources together while the sum of all current sources remains constant.

13. A system according to claim 12, in which a set of reference currents is summed to increase or decrease the output current.

14. A system according to claim 13, in which a set of m reference currents is each divided into n parallel paths under control of stored coefficient data and the current in the n paths is directed under control of stored sign data to a set of n current drivers to increase or decrease the output current, so that the sum of all current sources remains constant while the sum of the output currents from the current drivers changes.

15. A system according to claim 14, in which said set of stored coefficient data is manipulated by auxiliary register means in a register having at least n rows and m columns, said auxiliary register means having means for maintaining the sum of said coefficient data at a constant reference sum.

16. A register for storing and manipulating a set of k data coefficients comprising:

a set data storage cells arranged in n rows and m columns;

a set of control terminals responsive to control signals; and auxiliary register means for changing the contents of selected cells in response to said control signals while the sum of said k data coefficients remains constant.

17. A register according to claim 16, in which said data coefficients are changed in response to signals selected from the group comprising increment, decrement and reset.

18. A register according to claim 16, in which said auxiliary register means comprises means for:

(a) decrementing x cells in a first row of said register; and (b) automatically incrementing x rows in a second row of said register, both of said steps (a) and (b) being in response to the same control signal, so that data in x cells are transferred from said first row to said second row without changing the sum of data in those cells in said register that contain data.

19. A method of manipulating data in a register containing a set data storage cells arranged in n rows and m columns that contain a set of k data coefficients;

a set of control terminals responsive to control signals; and auxiliary register means for changing the contents of selected cells in response to said control signals while the sum of said k data coefficients remains constant, comprising the steps of:

resetting the contents of all cells to "0";

setting the contents of all cells in a main row to "1";

decrementing the main row by x bits and automatically incrementing a first row by x bits;

decrementing the first row by y bits and automatically incrementing a second row by y bits;

decrementing the second row by z bits and automatically incrementing a third row by z bits, whereby the sum of the bits in said register automatically remains constant.

* * * * *